(12) United States Patent

In't Veld et al.

(10) Patent No.: US 8,677,592 B2
(45) Date of Patent: Mar. 25, 2014

(54) METHODS FOR SEPARATING ELECTRONIC COMPONENTS UTILIZING A MANIPULATOR TO TRANSPORT THE ELECTRONIC COMPONENTS BETWEEN FIRST AND SECOND CUTTING TOOLS

(75) Inventors: Frederik Hendrik In't Veld, Brakel (NL); Joannes Leonardus Jurrian Zijl, Ede (NL); Hendrik Wensink, Eerbeek (NL)

(73) Assignee: Fico B.V., Duiven (NL)

( * ) Notice: Subject to any disclaimer, the term of this patent is extended or adjusted under 35 U.S.C. 154(b) by 730 days.

(21) Appl. No.: 12/065,136

(22) PCT Filed: Sep. 19, 2006

(86) PCT No.: PCT/NL2006/050228
§ 371 (c)(1),
(2), (4) Date: Jul. 30, 2008

(87) PCT Pub. No.: WO2007/035097
PCT Pub. Date: Mar. 29, 2007

(65) Prior Publication Data
US 2008/0289165 A1 Nov. 27, 2008

(30) Foreign Application Priority Data

Sep. 21, 2005 (NL) .................................... 1029992
Sep. 22, 2005 (NL) .................................... 1030004

(51) Int. Cl.
*B23P 19/02* (2006.01)
(52) U.S. Cl.
USPC ................. 29/426.4; 29/413; 225/2; 438/462

(58) Field of Classification Search
USPC ............... 29/424, 729–740, 412–413, 426.4;
438/460–466; 255/2, 96
See application file for complete search history.

(56) References Cited

U.S. PATENT DOCUMENTS 4,217,689 A * 8/1980 Fujii et al. .................... 438/465
4,355,457 A * 10/1982 Barlett et al. ................. 438/460
5,294,381 A * 3/1994 Iguchi et al. .................. 264/400

(Continued)

FOREIGN PATENT DOCUMENTS

EP         1 255 280          11/2002
EP         1 502 695          2/2005

(Continued)

OTHER PUBLICATIONS

International Search Report for PCT/NL2006/050228 dated Mar. 14, 2007.

(Continued)

*Primary Examiner* — Minh Trinh
(74) *Attorney, Agent, or Firm* — Nixon & Vanderhye P.C.

(57) ABSTRACT

The invention relates to a method for separating electronic components, comprising the processing steps of placing an assembly of electronic components on a manipulator, transporting the electronic components with the manipulator along a first cutting tool such that the assembly is cut through only partially along cutting lines in the thickness direction thereof, and transporting the partially severed assembly with a manipulator along a second cutting tool such that the cutting lines are severed almost completely. The invention also relates to a device for separating electronic components, and to a separated electronic component obtainable with the method.

13 Claims, 2 Drawing Sheets

(56) References Cited

U.S. PATENT DOCUMENTS

Figure 1:
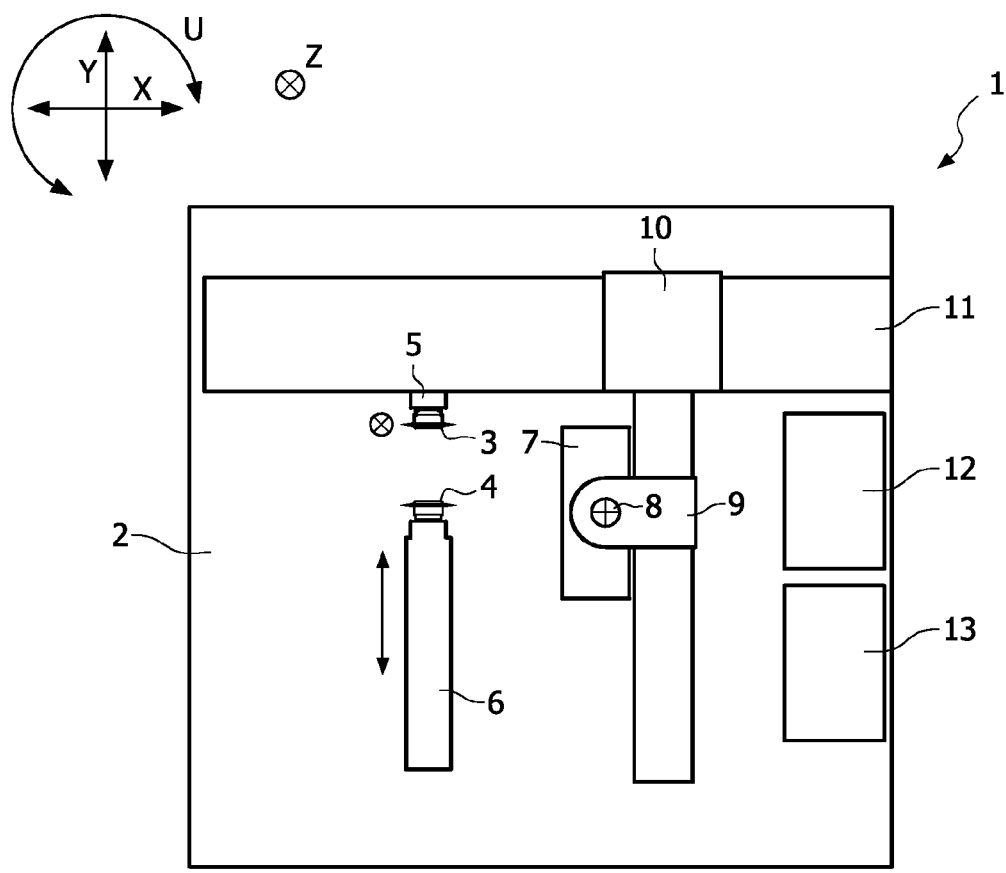

| | | | |
|---|---|---|---|
| 5,362,681 A * | 11/1994 | Roberts et al. | 438/464 |
| 5,597,767 A * | 1/1997 | Mignardi et al. | 438/14 |
| 5,622,900 A * | 4/1997 | Smith | 438/464 |
| 5,786,266 A * | 7/1998 | Boruta | 438/462 |
| 5,832,585 A * | 11/1998 | Takiar et al. | 29/424 |
| 6,372,610 B1 * | 4/2002 | Chang et al. | 438/460 |
| 6,593,170 B2 * | 7/2003 | Tateiwa et al. | 438/114 |
| 6,665,931 B2 * | 12/2003 | Yamaguchi et al. | 29/850 |
| 6,719,188 B2 * | 4/2004 | Farooq et al. | 228/264 |
| 6,757,964 B2 * | 7/2004 | Sasaki et al. | 29/737 |
| 7,098,396 B2 * | 8/2006 | Hanna et al. | 174/17 GF |
| 7,368,812 B2 * | 5/2008 | Akram | 257/686 |
| 7,419,885 B2 * | 9/2008 | Ishizuka | 438/460 |
| 7,665,201 B2 * | 2/2010 | Sjoedin | 29/592.1 |
| 7,735,216 B2 * | 6/2010 | Schnabel et al. | 29/740 |
| 2003/0100143 A1 | 5/2003 | Mulligan et al. | |
| 2003/0127428 A1 | 7/2003 | Fujii et al. | |
| 2005/0009237 A1 | 1/2005 | Yamaguchi | |

FOREIGN PATENT DOCUMENTS

| | | |
|---|---|---|
| JP | 61 095544 | 5/1986 |
| JP | 2000-021819 | 1/2000 |
| WO | 01/57922 | 8/2001 |

OTHER PUBLICATIONS

Written Opinion of the International Searching Authority dated Mar. 14, 2007.

* cited by examiner

METHODS FOR SEPARATING ELECTRONIC COMPONENTS UTILIZING A MANIPULATOR TO TRANSPORT THE ELECTRONIC COMPONENTS BETWEEN FIRST AND SECOND CUTTING TOOLS

This application is the U.S. national phase of International Application No. PCT/NL2006/050228 filed 19 Sep. 2006 which designated the U.S. and claims priority to Netherlands Application Nos. 1029992 filed September 2005 and 1030004 filed 22 Sep. 2005, the entire contents of each of which are hereby incorporated by reference.

The invention relates to a method for separating electronic components and to an associated device.

The separation of assembled electronic components has diverse applications. Examples are the dividing of wafers, packages and carriers (also referred to as lead frames or boards) with optionally encapsulated electronic components. Other examples include the dividing of so-called lab-on-chips or of glass chips which can for instance comprise channels, mixers, storage, diffusion chambers, integrated electrodes, pumps, valves and so forth. Such apparatuses are generally only several millimeters in size, wherein there is a continuing trend toward further miniaturization. Depending on the conditions, in the known method of separation use is made of a rotating saw blade with which the products for processing are sawn through. The assembly of the electronic components is picked up by a manipulator, held fast and displaced relative to the saw blade along the desired cutting lines, along which the assembly is therefore sawn. The electronic components are held in place on the manipulator during sawing thereof by means of for instance a vacuum suction force. The small dimensions of the electronic components do however mean that it is no longer readily possible to hold the components in place by means of vacuum suction force. Adhesive foils are therefore also used for this purpose, which have to be removed after separation of the components. Such foils can moreover leave residue behind on the electronic components, and this is of course undesirable. It is also necessary when adhesive foils are used to provide the known device with additional components such as for instance an unrolling unit for the foil, an inspection system, a UV source in the case UV foil is used, and a washing system for removing residue. This results in a considerable increase in costs.

The object of the present invention is to provide an improved method and device of the type stated in the preamble with which at least the above stated problems can be prevented, and with which a greater separating precision can be obtained than according to the prior art.

The invention provides for this purpose a method with the characteristics according to claim 1. More specifically the method for separating electronic components according to the invention comprises of placing an assembly of electronic components on a manipulator, transporting the electronic components with the manipulator along a first cutting tool such that the assembly is cut through only partially along cutting lines in the thickness direction thereof, and transporting the partially severed assembly with a manipulator along a second cutting tool such that the cutting lines are severed almost completely, and preferably completely. By as it were dividing the separation according to the invention into two sub-processes, wherein in the first sub-process a first cutting tool cuts only partially into the assembly along the desired cutting lines, whereafter final severing takes place in the second sub-process by means of a second cutting tool, it has been found possible to avoid the use of adhesive foil without this adversely affecting the quality of the separating precision, this also particularly for electronic components of small dimensions.

The depth to which the assembly is partially cut in the thickness direction in the first processing step is not limited. It is thus possible for instance to make a cut with a depth of 10% to more than 90% of the thickness. This depth preferably amounts to between 35% and 65% of the thickness of the assembly. It has been found that the advantages of the method according to the invention thus become best manifest. In a typical application a so-called QFN (Quad Flad No Lead) assembly with a thickness of 850 is sawn through in the first processing step to depths of 300 to 500.

The manipulator will in practice transport the electronic components with a plurality of linear movements along the cutting tools, and the manipulator is displaceable in a plane for this purpose. It is optionally also possible to rotate the manipulator in the plane in which the manipulator is displaceable. Saw cuts can thus be made in different directions in the assembly of electronic components; after rotating the electronic components through for instance 90° saw cuts can be made in the assembly at an angle of 90° relative to the saw cuts made in the assembly prior to rotation.

Before beginning a separating process the manipulator can be displaced to a loading position for loading of the manipulator with electronic components and, after performing of a separating process, be displaced to an unloading position for unloading thereof, wherein the loading position and the unloading position are separate positions. A part of the handling of the electronic components is thus provided by the manipulator.

It is also advantageous if the manipulator is moved above the saw blades. The electronic components must be mounted for this purpose on the underside of the manipulator. As already stated above, an advantage of the invention is that engaging of the electronic components does not require much force and can be realized in simple manner, for instance using underpressure.

In a preferred embodiment of the method according to the invention the assembly is transported for partial severing in the thickness direction along a first cutting tool in the form of at least one saw blade. Because the assembly according to the invention is only partially severed by the saw blade, and the assembly therefore still acts as one whole, the assembly can be easily held in place, if desired without having to make use of adhesive foil or other aids. Because a large number of parallel saw cuts must usually be made in a product, it is appropriate—although not essential—to perform the method in a separating device with two parallel saw blades driven by two different spindles such that the mutual distance between the saw blades is adjustable subject to the dimensions of the products for processing and the manner in which the saw cuts are made. Once the mutual distance between the saw blades has been set, the saw blades are displaced relative to the product for processing for the purpose of performing the sawing operations. An additional advantage of the method according to the invention is that wear of the saw blade is less than in the known method, whereby it does not have to be replaced so quickly.

As already indicated above, in the known process an assembly, for instance in the form of a strip, is first arranged on a foil. The foil is necessary in order to be able to handle the electronic components after the strip has been sawn through completely. Both in the known method and in the method according to the invention it is recommended to dry the strip after it has been sawn through (and for the invention after it has been partially sawn through). Because in the known method a foil must necessarily be used, the drying temperature is limited. The method according to the invention does not have this limitation, whereby drying can be carried out at much higher temperatures than is the case in the known method, which increases the production speed.

In a further preferred embodiment of the method the assembly is then transported, for the purpose of almost complete severing, along a second cutting tool which comprises at least one laser beam, wherein the assembly is manipulated such that the laser beam is carried along the already precut cutting lines, wherein these are cut through further. It is also possible in practice for the laser beam to be displaced by having it scan the surface of the assembly via moving mirrors. In the second processing step the depth of focus of the laser beam will generally be chosen such that the cutting lines are fully severed, and the assembly is therefore wholly separated. It is however also possible according to the invention to adjust the depth of focus of the laser such that a portion of the assembly is not severed in the thickness direction. In such a case complete separation can then be obtained by a final processing step wherein the assembly is broken along the cutting lines. This is particularly advantageous when the assembly (and therefore the electronic components) is built up of a relatively brittle layer and a relatively ductile layer. The ductile layer, for instance a copper layer, can then be precut in a first processing step, for instance by a saw blade, whereafter the relatively brittle layer, for instance a ceramic substrate, is then partially cut through further by a laser beam, whereafter the final separation is obtained by breaking the partially cut-through ceramic layer. A further advantage of applying a laser beam in the second—and usually final—processing step is that no water need be used here, this in contrast to the known method wherein water is essential for cooling of the saw blades. During cooling with water at least a portion thereof will penetrate into the thus separated electronic components. These therefore have to be dried at increased temperature after separation, which entails additional cost and can possibly result in products of reduced quality. The present preferred embodiment of the method according to the invention does not have this drawback.

In a preferred embodiment the method according to the invention is characterized in that the first cutting tool and the second cutting tool act on the same surface of the assembly. This has the advantage that the assembly can be guided by the same manipulator along both the first and the second cutting tool, this enhancing the speed and precision of the process.

In another preferred embodiment the method is embodied such that the first cutting tool and the second cutting tool act on first and second surfaces of the assembly. This has particular advantages in the separation of an assembly comprising multiple layers. As already stated above, a multilayer assembly may comprise layers of differing materials or a combination of differing materials. A typical assembly comprises for instance a silicon and a glass layer mutually connected by means of a plastic adhesive layer. This unit is typically provided with a conductive layer of metal, for instance copper. The method according to the invention is then advantageously applied by making with a saw blade a first pattern of saw cuts of a determined cutting depth from a first surface of the assembly, wherein that surface is chosen in which there are layers which can be cut relatively easily by a saw blade. In a second processing step a second corresponding pattern of saw cuts is subsequently made with a laser beam from a second surface of the assembly—preferably opposite the first surface—with a cutting depth extending approximately to the plane of the cutting depth of the first saw cuts, wherein those layers which can be cut relatively easily by a laser beam are advantageously situated on the second surface. A further advantage of the method according to the invention is that it becomes possible to obtain different cutting characteristics from different surfaces. This is understood to mean that it is for instance possible from a surface—for instance the upper surface—to cut relatively complicated forms with a laser beam—which is highly suitable for this purpose—and from the opposite surface—the lower surface—to obtain relatively smooth cuts with a saw blade—which is highly suitable for this purpose. This results in additional flexibility in implementation.

There are further advantages in characterizing the method according to the invention in that the cutting thickness of the first cutting tool differs from the cutting thickness of the second cutting tool. Cutting thickness is understood to mean the thickness of the (partial) cutting line made as seen from the surface of the assembly. It becomes possible in this way to obtain separation side surfaces which are not purely linear but which are offset, for instance halfway along the depth thereof. This can be favourable for specific applications.

Another preferred embodiment of the method comprises of the first cutting tool cutting with a first cutting thickness through the assembly from a first surface as far as a first cutting depth, and of the second cutting tool cutting with a second cutting thickness through the assembly a number of layers from a second surface. In a particular preferred embodiment the second cutting depth herein partially overlaps the first cutting depth, whereby a number of layers which have already been cut to the first cutting thickness by the first cutting tool are subsequently cut through again to the second cutting thickness from the other surface by the second cutting tool. By selecting a second cutting thickness greater than the first cutting thickness a separated electronic component can thus be obtained in very simple manner which is provided with an outer, preferably conductive layer which protrudes along at least one side relative to the underlying layers. Such a component can for instance be a chip with a conductive copper layer on one side which protrudes slightly relative to the underlying ceramic or plastic layers. Such component is then obtained by first cutting to a first cutting thickness into an assembly using a saw blade as far as a first cutting depth roughly corresponding to the copper layer thickness, and subsequently cutting from the other side into the layers as far as the copper layer using a laser beam to a second cutting thickness which is greater than the first cutting thickness.

The invention also relates to a device for separating electronic components as described in claim 11. Such a device comprises at least first and second cutting tools with associated drive means, at least one manipulator for carrying and displacing an assembly of electronic components relative to the cutting tools, drive means for transporting the manipulator along the first cutting tool such that the assembly is cut through only partially along cutting lines in the thickness direction thereof, and drive means for transporting the manipulator along the second cutting tool such that the cutting lines are almost fully severed.

A preferred embodiment of the device comprises a first cutting tool in the form of a saw blade. Another preferred embodiment comprises a second cutting tool in the form of a laser source. Further preferred embodiments are described in claims 14-17. For the advantages hereof reference is made to the advantages described above in respect of the method according to the invention.

The functionality of the device according to the invention can for instance be obtained in that the manipulator is displaceable in two horizontal directions and a vertical direction and is rotatable in a horizontal plane. It is also usual and efficient if the device also comprises a frame for supporting at least the drive means and the manipulator. In addition, the frame can also be adapted to comprise a loading position and an unloading position, control means such as a computer, sensors, controls, displays, cooling means, cleaning means and so forth. In an advantageous embodiment variant the manipulator is further located above the cutting tools. Waste material will thus not be able to cause very much disruption during the separation, and contaminants are (partially) removed from the electronic components by the gravitational force.

In a preferred variant the device is provided with a measuring/control mechanism with feedback for determining the position of the manipulator relative to the cutting tools. This is of particular importance because, certainly in the first processing step, it may be necessary to precisely determine the cutting depth of the partial cut.

Although the device according to the invention can be constructed in compact manner, wherein first and second cutting tools are for instance arranged on the same frame, it can be advantageous to characterize a device according to the invention in that it comprises a first and a second unit, wherein the first unit comprises at least a first cutting tool with associated drive means, at least one manipulator for carrying and displacing an assembly of electronic components relative to the first cutting tool, and drive means for transporting the manipulator along the first cutting tool such that the assembly is cut through only partially along cutting lines in the thickness direction thereof, and wherein the second unit comprises at least a second cutting tool with associated drive means, at least one manipulator for carrying and displacing an assembly of electronic components relative to the second cutting tool, and drive means for transporting the manipulator along the second cutting tool such that the cutting lines are almost fully severed. Using such a device it becomes possible to perform both processing steps separately if desired, this being efficient for instance when the speeds of the two processing steps differ.

A further preferred variant of such a device also comprises transporting means for displacing the partially severed assembly of electronic components from the first to the second unit. Such a device has the additional advantage that in the meantime—between the first and the second processing step—the partially severed assembly can be integrally tested, because partial severing results in electrically isolated packages. Depending on the final product size and the method applied for handling the partially severed assembly, this latter can be supported for the second processing step by means of underpressure by being placed on so-called vacuum cups. Another option comprises a support in the form of a glass chuck, or an inexpensive wafer tape.

Figure 2:
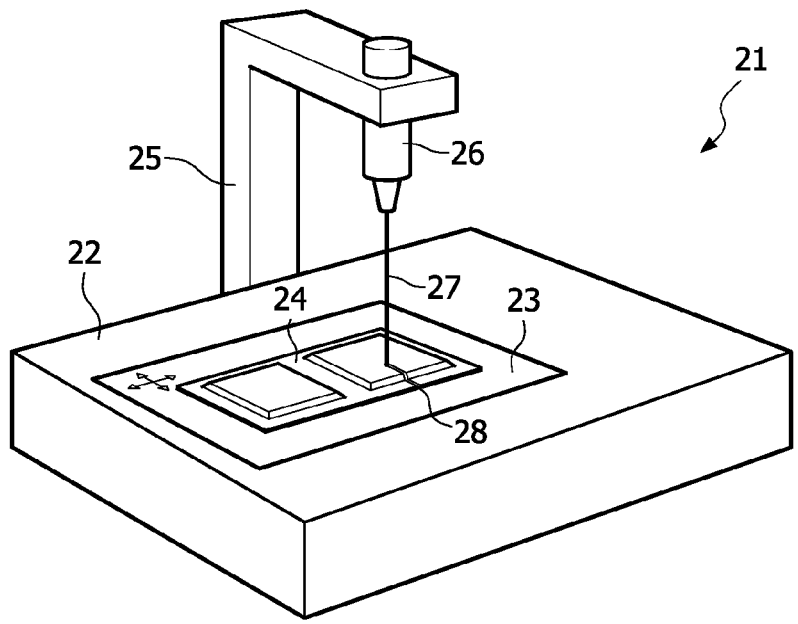
Figure 3A:
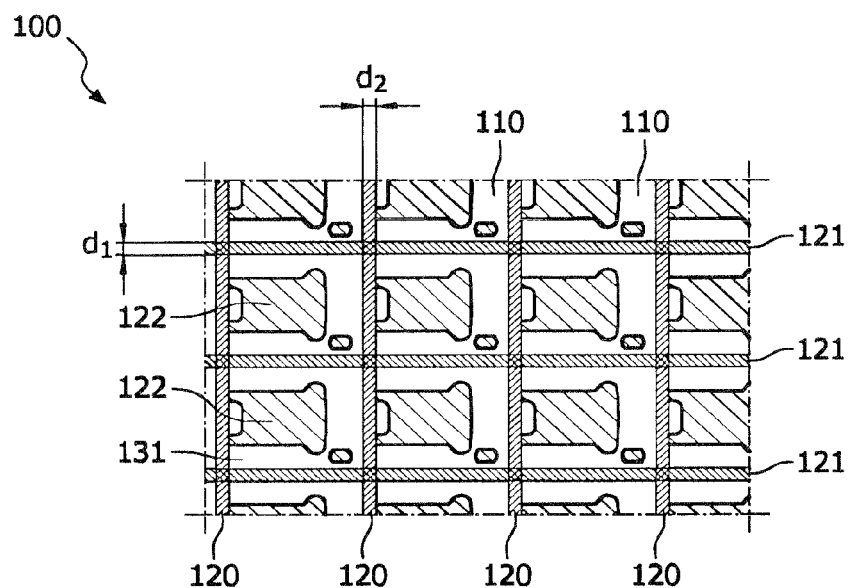
Figure 3B:
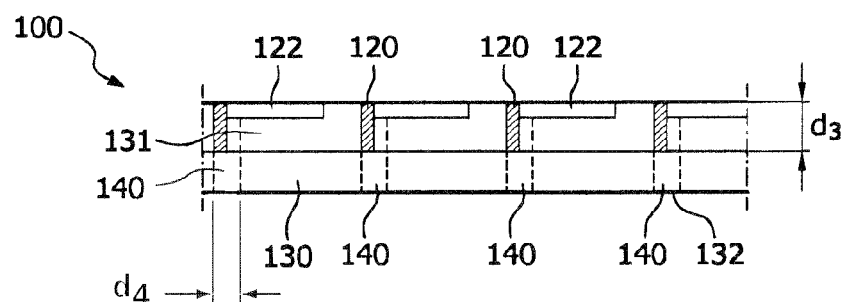
Figure 3C:
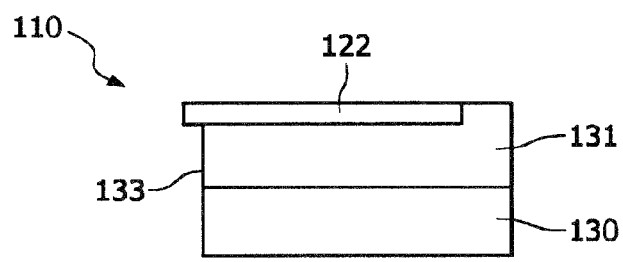

The present invention will be further elucidated on the basis of the non-limitative exemplary embodiments shown in the following figures. Herein:

FIG. 1 shows a schematic top view of the first unit of a device according to the invention, FIG. 2 shows a schematic top view of the second unit of a device according to the invention, FIG. 3a shows a top view of a partially severed assembly of electronic components following the first processing step, FIG. 3b shows the assembly of FIG. 3a in side view, and FIG. 3c shows finally a side view of an electronic component after complete separation thereof.

FIG. 1 shows a first part (the first unit) of a device 1 with a frame 2 on which two rotatable saw blades 3, 4 are arranged. The rotatable saw blades 3, 4 are carried and rotated by respective rotation shafts 5, 6. A first rotation shaft 5 is displaceable perpendicularly of the plane of view (in Z-direction) and a second rotation shaft 6 is displaceable in Y-direction. Saw blades 3, 4 are each driven via their respective rotation shafts 5, 6 by an electric motor (not shown). A manipulator 7 is displaceable in four directions (X, Y, Z and U). For this purpose the manipulator is assembled with a carriage 9 via a vertical rotation shaft 8 (U-rotation), this carriage 9 being displaceable linearly (in Y-direction) along a guide carriage 10. Guide carriage 10 is in turn displaceable linearly (in X-direction) along a stationary linear guide 11. For the vertical movement (Z-direction) manipulator 7 is also displaceable in this direction by rotation shaft 8. The frame is also provided with a loading position 12 for loading of manipulator 7 with electronic components, and an unloading position for unloading the manipulator 7.

FIG. 2 shows a second part (the second unit) of device 21 with a frame 22 provided with a displaceable carrier 23. Carrier 23 is adapted to support an assembly of electronic components 24 to be processed. Frame 22 also bears via an arm 25 a laser source 26 with which a laser beam 27 is generated which can be directed at the already partially severed assembly of electronic components 24, as a result of which the assembly of electronic components 24 is provided with a cut 28 along the desired cutting lines. Carrier 23 and laser source 26 are displaceable relative to each other. Such a relative displaceability must also be understood to mean displacing of laser beam 27 relative to carrier 23 using directing means (not shown) such as movable mirrors and/or prisms. Such a situation occurs for instance in the case of a galvohead laser device. If desired, the second unit 21 is further provided with optical equipment to direct laser beam 27 at the assembly at the desired focus distance. Laser source 26 can optionally be adapted to generate a pulsating laser beam. Because according to the invention the assembly 24 is already partially severed during the first processing step, less material deposition on the components 24 to be separated occurs during the laser cutting than in the known method.

The assembly 100 of electronic components partially severed by the first part of device 1 is displaced from the first to the second unit by means of transporting means not shown in the figures.

FIG. 3a shows in top view a partially severed assembly 100 of electronic components 110 after the first processing step. Assembly 100 is provided with saw cuts 120, 121 running along the desired cutting lines. The saw cuts 121 running horizontally in FIG. 3a can herein have the same thickness "d1" as the thickness "d2" of the vertically running saw cuts 120, although this is not essential. Assembly 100 comprises on the top side thereof conductive portions (copper leads 122). Referring now to FIG. 3b, assembly 100 is built up in cross-section of two layers: a substrate layer 130 of for instance glass-filled plastic or ceramic material, and a second layer 131 of for instance glass-filled plastic incorporating a number of conductive portions 122 of for instance copper. As shown in FIG. 3b, the assembly is provided with saw cuts 120 which extend in the thickness direction through a depth "d3" as far as the substrate layer 130. Also referring to FIG. 3c, a separated electronic component 110 is obtained in the second processing step by making cuts 140 by means of a laser beam in the partially severed assembly 100 from the bottom surface 132 adjoining layer 130. These laser cuts 140 are shown in FIG. 3b with broken lines having a thickness "d4" which is greater than the thickness "d2" of the saw cuts 120. Laser cuts 140 herein run as far as the interface with the copper leads 112 so that an edge of the copper leads 112 is undercut by the laser cuts 140. This creates a separated electronic component 110 comprising an outer conductive layer 122 having an edge which protrudes along at least one side 133 relative to the underlying layers 130, 131. In some applications such a protruding conductive layer is an advantage. The method according to the invention has the additional advantage that no separate operations have to be performed for this purpose, such as for instance cutting away of layers.

The invention claimed is:

1. A method for separating electronic components, comprising the processing steps of:
    A) placing an assembly of electronic components on a manipulator, the assembly comprising a first substrate layer, a second component layer on the first substrate layer, and an outer conductive layer on the second component layer,
    B) transporting the electronic components with the manipulator relative to a first cutting tool and cutting to a first cutting depth of at least 10% or more of a thickness of the first and second layers of the assembly with the first cutting tool along first cutting lines such that the assembly is only partially cut through the thickness thereof to obtain a partially severed assembly of electronic components,
    C) transporting the partially severed assembly of electronic components with the manipulator relative to a second cutting tool and further cutting through the thickness of first and second layers of the partially severed assembly of electronic components to a second cutting depth along second cutting lines which overlap the first cutting lines so that the electronic components are at least substantially severed almost completely one from another, and
    D) separating the substantially severed electronic components along the cutting lines.

2. The method as claimed in claim 1, wherein step B) is practiced using a saw blade as the first cutting tool.

3. The method as claimed in claim 1, wherein step C) is practiced using a laser beam as the second cutting tool.

4. The method as claimed in claim 1, wherein steps B) and C) include positioning the first cutting tool and the second cutting tool so that each of the first and second cutting tools acts on the same surface of the assembly.

5. The method as claimed in claim 1, wherein steps B) and C) include positioning the first cutting tool and the second cutting tool so each of the first and second cutting tools acts on first and second surfaces of the assembly, respectively.

6. The method as claimed in claim 1, wherein the first and second layers comprise differing materials or combinations of differing materials.

7. The method as claimed in claim 1, wherein steps B) and C) include operating the first and second cutting tools so that the first cutting depth cut by the first cutting tool differs from the second cutting depth cut by the second cutting tool.

8. The method as claimed in claim 1, wherein step B) includes operating the first cutting tool so as to cut the first cutting depth through the second layer from an upper surface of the assembly, and wherein step C) includes operating the second cutting tool so as to cut the second cutting depth through the first layer from a lower surface of the assembly.

9. The method as claimed in claim 8, wherein steps A) and B) are practiced such that the second cutting depth at least partially overlaps the first cutting depth with at least some of the first cutting lines are positioned adjacent an edge of the outer conductive layer and with the second cutting lines having a thickness which is greater than the thickness of the first cutting lines so that the second cutting lines undercut the outer conductive layer, whereby the edge of the outer conductive layer protrudes outwardly from the separated electronic components when separated from one another according to step (D).

10. The method of claim 1, wherein step B) is practiced so that the first cutting depth is between 35% to 65% of the thickness of the assembly.

11. The method of claim according to claim 10, wherein step B) is practiced by cutting through an upper surface of the assembly with the cutting tool, and wherein step C) is practiced by cutting through a lower surface of the assembly with the second cutting tool so that the first and second cutting depths of the first and second cutting lines, respectively, at least partially overlap.

12. A method for separating electronic components, comprising the processing steps of:
    A) placing an assembly of electronic components on a manipulator, the assembly comprising a first substrate layer which defines a lower surface of the assembly, a second component layer on the first substrate layer which defines an upper surface of the assembly, and an outer conductive layer on the upper surface of the assembly,
    B) transporting the electronic components with the manipulator relative to a first cutting tool and cutting through at least a portion of the second layer from the upper surface of the assembly with the first cutting tool along first cutting lines having a first cutting line thickness and a first cutting line depth which is at least 10% or more of a thickness of the first and second layers such that the assembly is only partially cut through the thickness of the first and second layers thereof to obtain a partially severed assembly of electronic components,
    C) transporting the partially severed assembly of electronic components with the manipulator relative to a second cutting tool and further cutting through the thickness of assembly along second cutting lines having a second cutting line depth which overlaps with the first cutting line depth and a second cutting line thickness which is greater than the first cutting line thickness so as to undercut the conductive layer so that the electronic components are at least substantially severed almost completely one from another and so that an edge of the conductive layer protrudes outwardly from the electronic components, and
    D) separating the substantially severed electronic components along the cutting lines.

13. The method as claimed in claim 12, wherein step B) is practiced using a saw blade as the first cutting tool, and wherein step C) is practiced using a laser beam as the second cutting tool.

* * * * *